United States Patent [19]

Darling, Jr.

[11] Patent Number: 5,574,379
[45] Date of Patent: Nov. 12, 1996

[54] SYSTEM FOR MEASURING ELECTROMAGNETIC PROPERTIES

[75] Inventor: Phillip H. Darling, Jr., Buena Park, Calif.

[73] Assignee: Northrop Grumman Corporation, Los Angeles, Calif.

[21] Appl. No.: 388,761

[22] Filed: Feb. 15, 1995

Related U.S. Application Data

[63] Continuation of Ser. No. 992,238, Dec. 17, 1992, Pat. No. 5,393,557.

[51] Int. Cl.⁶ .................................................. G01R 27/32
[52] U.S. Cl. ........................................................... 324/642
[58] Field of Search ................................ 324/642, 637; 427/10, 248.1, 553, 595

[56] References Cited

U.S. PATENT DOCUMENTS

| | | | |
|---|---|---|---|
| 2,940,040 | 6/1960 | Rosenthal | 324/71 |
| 3,562,642 | 2/1971 | Hochschild | 324/637 |
| 3,818,335 | 6/1974 | Stungis et al. | 324/65 R |
| 3,936,736 | 2/1976 | Ray | 324/642 |
| 4,408,156 | 10/1983 | Veys | 324/58.5 |
| 4,492,915 | 1/1985 | Caspers | 324/637 |
| 4,500,835 | 2/1985 | Heikkila | 324/58.5 |
| 4,607,212 | 8/1986 | Jakkula | 324/58.5 |
| 5,012,248 | 4/1991 | Munro et al. | 342/22 |
| 5,086,279 | 2/1992 | Wochnowski et al. | 324/637 |
| 5,097,227 | 3/1992 | Yuan et al. | 324/637 |
| 5,141,595 | 8/1992 | Darling, Jr. | 156/610 |
| 5,185,579 | 2/1993 | Mertens et al. | 324/637 |
| 5,216,372 | 6/1993 | Zoughi | 324/642 |
| 5,230,924 | 7/1993 | Li | 427/229 |
| 5,268,062 | 12/1993 | Darling, Jr. | 156/610 |

OTHER PUBLICATIONS

"Nondestructive Microwave Scanning Measurements For Material Property Evaluation," P. R. Wims D. D. Palamer, *Review of Progress in Auantitative Nondestructive Evaluation*, vol. 10A, Plenum Press, New York, 1991.

*Primary Examiner*—Maura K. Regan
*Attorney, Agent, or Firm*—Terry J. Anderson; Karl J. Hoch, Jr.

[57] ABSTRACT

A system for measuring the electromagnetic properties of a member without physically contacting the member. The system includes an electromagnetic energy transceiver having a transmitting and receiving antenna. The antenna is positioned in close proximity but spaced from to the member being tested. Electromagnetic energy, such as microwave energy, is transmitted by the transceiver at the member being tested. Electromagnetic energy that has been reflected by the member back to the antenna is received at the antenna. The transceiver generates an output that is proportional to the reflected electromagnetic energy and, thus, is proportional to the non-reflected electromagnetic energy absorbed by the member being tested. The output signal can thus be used to indicate resistivity of the member to electrical transmission or other electromagnetic properties such as magnetic susceptibility. The output signal can be connected to a drive controller of a high temperature coating system to increase or decrease electrical resistivity of the member while it is being manufactured to thereby control or to maintain a predetermined electrical resistivity or other electromagnetic property such as magnetic susceptibility of the member at a desired quality.

11 Claims, 1 Drawing Sheet

SYSTEM FOR MEASURING ELECTROMAGNETIC PROPERTIES

CROSS-REFERENCE TO RELATED APPLICATIONS

This application is a continuation of application Ser. No. 07/992,238 filed 17 Dec. 1992, now U.S. Pat. No. 5,393,557.

BACKGROUND OF THE INVENTION

1. Field of the Invention

The present invention relates to a system for measuring electromagnetic properties of a member and, more particularly, to a system that does not physically contact the member while the property is being measured.

2. Prior Art

U.S. Pat. No. 5,141,595 (Darling, Jr.) discloses a method and apparatus for coating fibrous refractory substrates with a highly uniform layer of graphite or other material. Electrical pick-ups are used with an electronic control and transport motor for physically altering substrate transport velocity, or other parameters, to adjust the coated substrate's properties.

U.S. Pat. No. 5,268,062 (Darling, Jr.), a continuation of Darling, Jr. '595, discloses the method and apparatus of Darling, Jr. '595 for coating rigid porous refractory substrates.

U.S. Pat. No. 4,408,156 (Veys) discloses the use of microwave radiation to detect thin conductive fibers placed on a sheet article of non-conductive material for identification purposes. The system computes the difference between transmitted and reflected radiation.

U.S. Pat. Nos. 4,500,835 (Heikkila) and 4,607,212 (Jakkula) disclose the use of microwave radiation for detecting grain direction and knots in lumber.

U.S. Pat. No. 3,818,335 (Stungis et al.) discloses use of probes to monitor and detect the applied amounts of conductive material on a moving non-conductive web. U.S. Pat. No. 2,940,040 (Rosenthal) discloses the measurement of direct current resistivity of plastic materials for quality control purposes.

U.S. Pat. No. 5,012,248 to Munro et al. discloses the measurement of the thickness of a radar absorbing coating by receiving reflected radio frequency energy from the coating through a dielectric impedance matching element which is physically placed against the coating.

"Nondestructive Microwave Scanning Measurements for Material Property Evaluation," by P. R. Wims and D. D. Palmer, *Review of Progress in Quantitative Nondestructive Evaluation*, Vol. 10A, Plenum Press, New York, 1991, describes a system for measuring properties of radar absorbing material by illuminating small volumes of a test sample with microwave energy while the specimen is maneuvered between two antennas by an automated translation stage.

SUMMARY OF THE INVENTION

In accordance with one method of the present invention, a method for controlling a conductive member manufacturing apparatus is provided comprising steps of transmitting electromagnetic energy from an antenna of a transceiver to an area of the member, the member being in substantially close proximity to, but spaced from, the antenna; receiving reflective electromagnetic energy at the antenna that has been reflected by the member back to the antenna; and transmitting a signal from the transceiver to a controller of the apparatus to increase or decrease a predetermined process that influences resistivity of the member based upon received reflected electromagnetic energy thereby controlling resistivity of the member while it is being manufactured.

In accordance with another method of the present invention, the method of controlling applications of a high temperature coating to a sheet material is provided comprising steps of providing a coating system adapted to apply the high temperature coating to the sheet material, the system having a drive adapted to move the sheet material as the coating is being applied; transmitting electromagnetic energy from an antenna of a transceiver to a portion of the sheet material having been coated by the high temperature coating; receiving reflected electromagnetic energy at the antenna that has been reflected by the portion back to the antenna; and changing the speed of the drive based upon an amount of received reflected electromagnetic energy such that application of the high temperature coating to the sheet material can be increased or decreased along a length of the sheet material to maintain a predetermined quality control.

In accordance with another method of the present invention, a method of testing magnetic susceptibility of a non-conductive member is provided comprising steps of positioning a transceiver proximate to but spaced from an area of the non-conductive member to be tested, the transceiver having an antenna, means for transmitting electromagnetic energy, means for receiving electromagnetic energy, and means for generating an output signal based upon received electromagnetic energy; transmitting electromagnetic energy from the antenna to the area; receiving reflected electromagnetic energy at the antenna that has been reflected by the member back to the antenna; generating an output signal from the transceiver corresponding to the amount of reflected electromagnetic energy received by the antenna; and determining absorption of the transmitted electromagnetic energy-by the non-conductive member based upon received reflected electromagnetic energy and the size of the area being tested.

In accordance with an apparatus of the present invention, a system for measuring an electromagnetic property of a coated member is provided, comprising a transceiver disposed proximate to but spaced from an area of the coated member, a power supply connected to an input of the transceiver for providing electrical current thereto, a linearizing amplifier connected to the transceiver for receiving and amplifying an output signal from the transceiver which is representative of the electromagnetic property being measured, and a readout connected to the linearizing amplifier for displaying the value of the measured electromagnetic property in a preselected display format.

In a further embodiment of the apparatus of the present invention, the apparatus further comprises a controller also connected to the linearizing amplifier and to the readout for receiving the output signal and adjusting a manufacturing process parameter of an apparatus for coating the member.

In still another embodiment, the system includes a backing plate disposed in association with the transceiver proximate a surface of the coated member opposite from the transceiver.

BRIEF DESCRIPTION OF THE DRAWINGS

The foregoing aspects and other features of the invention are explained in the following description, taken in connection with the accompanying drawings, wherein.

DETAILED DESCRIPTION OF THE INVENTION

Figure 1:
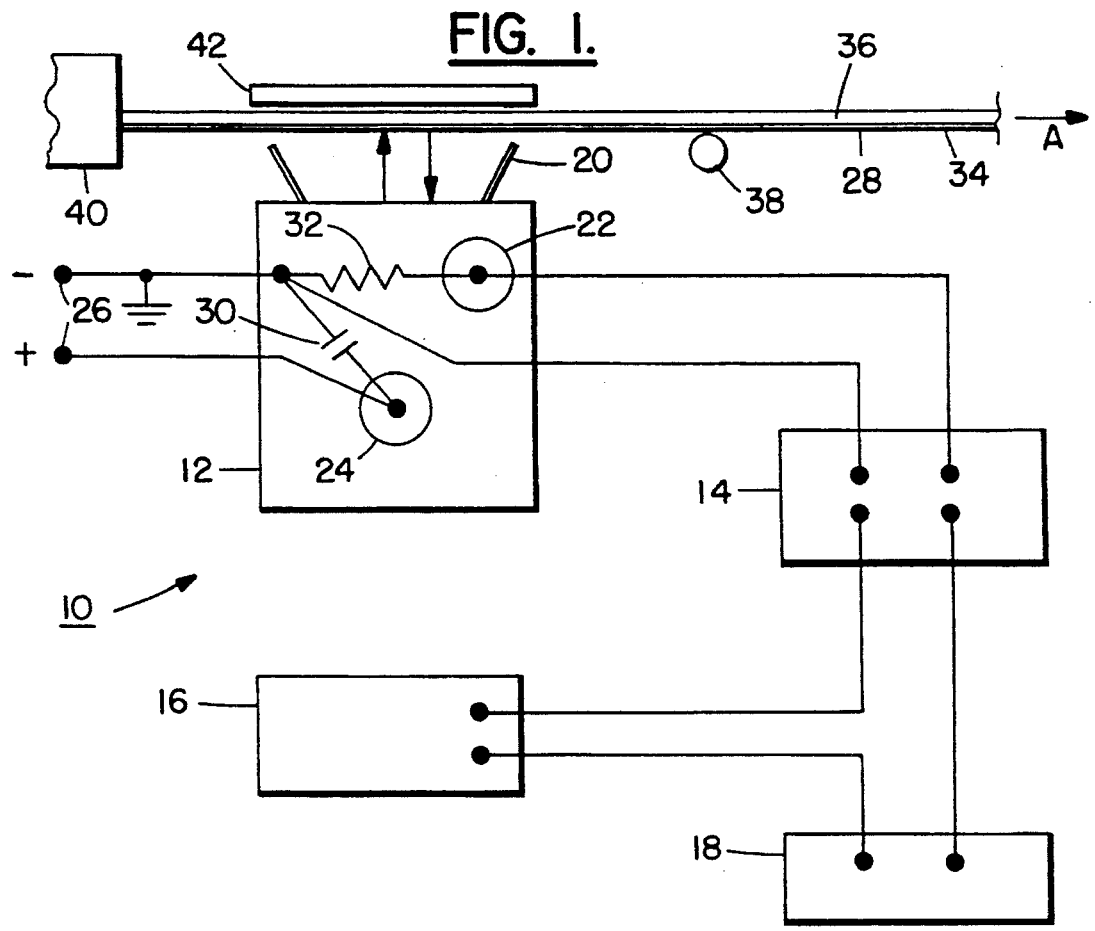
FIG. 1 is a schematic diagram of a system incorporating features of the present invention.

FIG. 1 is a schematic diagram of a system 10 used to measure electrical resistivity of a member incorporating features of the present invention. Although the present invention will be described with reference to the embodiment shown in the drawings, it should be understood that the present invention can be embodied in various different forms of embodiment. In addition, any suitable size, shape or type of members, elements or materials could be used as further understood below.

The system 10 generally comprises a transceiver 12, a linearizing amplifier 14, a readout 16, and a controller 18. The transceiver 12 generally comprises an antenna 20, a mixer 22, and an oscillator 24. In a preferred embodiment, the transceiver 12 is an electromagnetic energy transmit and receive unit. The transceiver 12 is a preferably a microwave transmit and receive unit such as Type GOS2580 Motion Detector Module manufactured by Alpha Industries, Inc. which can transmit microwave energy at a frequency of about 10.525 GHz. The transceiver 12 operates with an 8 volt DC input at input terminals 26.

The antenna 20 is preferably a horn antenna that can both transmit a nearly parallel unguided beam of microwaves at a member 28 and receive microwaves reflected by the member 28 back to the antenna. The waves entering the antenna as reflected energy produce a DC-voltage across the load resistance. This voltage is representative of the energy reflected. The mixer 22 is preferably a Schottky barrier diode and the oscillator 24 is preferably a Gunn diode that acts as an emitter and local oscillator. The transceiver is supplied with a capacitor 30 fitted between the Gunn bias terminal and ground to suppress bias circuit oscillations. The mixer output terminal is fitted with a load resistor 32, such as a 12K resistor.

Figure 2:
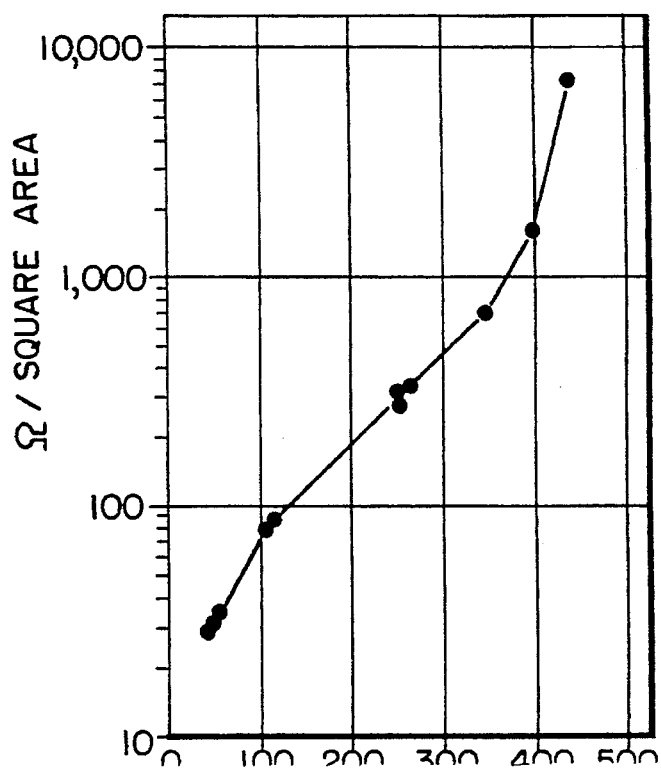
FIG. 2 is a graph of sample test results of the system shown in FIG. 1.

The DC voltage component of the mixer, output to amplifier 14 for the preferred embodiment described above, is shown in FIG. 2. The output is proportional to the electrical resistance of the member 28 at the antenna 20. The output generally ranges from about 50 mv DC to about 450 mv DC. FIG. 2 shows the output of the transceiver 12, measured in DC volts, plotted relative to the resistivity of the area of member 28 at the antenna 20 as further understood below. In actuality, the area used in the resistivity calculation is the volume of the member 28 at the antenna 20, but is described herein as the simplified term of area due to the relatively thin thickness of the member 28.

In order to insure accurate and uniform measurements of reflected microwave energy, the system 10 includes a backing plate 42 located opposite the antenna 20. The backing plate 42 is provided to insure that the member 28 is in a restrained plane at the area of the antenna 20 while being tested. However, any suitable type of restraining system could be provided. In addition, the backing plate 42 also provides the function of at least partially constraining the member 28 at a predetermined spacing from the antenna 20. However, any suitable type of spacing system could be provided.

The DC voltage component of the mixer output is sent to the linearizing amplifier 14. In a preferred embodiment, a linearizing DC transmitter, such as AP4155 manufactured by Action Instruments Inc. of San Diego, Calif., is used. The linearizing amplifier 14 has an input amplifier, in series of twelve gain stages, and an output amplifier. The DC signal is fed to the input amplifier which drives the series of twelve gain stages. The gain stages are activated in turn at DC input levels predetermined at the factory for best 12-segment linearization; the segments are more closely grouped at the most non-linear portions of the input curve. Each stage adds to or subtracts from the gain of the preceding stage as necessary to correct the input non-linearity. The linearization stage allows adjustment of zero, and drives an output buffer stage which allows adjustment of span. The amplifier 14 produces a current output (e.g. 4–20 mA) that is a constant-current source controlled by the buffer stage. For a DC input of 49 mv to 450 mv, the output is preferably between about 4 mA to about 20 mA.

The current output from the linearizing amplifier 14 is directed to the readout 16 and the drive control 18. The readout 16 is preferably a digital readout, such as the VISIPAK V500 line of digital process indicators manufactured by Action Instruments, Inc. of San Diego, Calif., to display a readout in ohms per square area at antenna 20. The controller 18 is part of a coating system adapted to apply a high temperature coating 34 to a sheet material 36 that constitutes the member 28. Any suitable drive, such as including drive rollers 38, can be used to help move the member 28 in the direction illustrated by arrow A out of the coating applicator 40. The controller 18 is adapted to control the speed of the drive and thereby control the amount of coating being applied to a length of the sheet material 36.

In a preferred method of the present invention, the sheet material or substrate 36 is made of a woven-type yarn, such as NEXTEL 312 fiber having 62% aluminum oxide ($Al_2O_3$), 14% boron oxide ($B_2O_3$), and 25% silicon dioxide ($SiO_2$) by weight. The fibers are woven into a fabric of 300 denier, 5 harness satin weave, 60×60 yarns/inch. Of course, any suitable substrate could be used.

The coating applicator 40 is substantially the same as the system described in U.S. Pat. Nos. 5,141,595 and 5,268,062 which are hereby incorporated by reference. The system 40 is used to apply the electrically conductive superstrate or graphite coating 34 to the substrate 36. The faster the speed of the substrate 36 through the system 40, the thinner the layer of superstrate 34. The thinner the layer of superstrate 34, the higher the resistivity of the member 28.

Thus, the faster the speed of the substrate 36 through the system 40, the higher the resistivity of the member 28. Conversely, the slower the speed of the substrate 36 through the system 40, the thicker the layer of superstrate 34 and the lower the resistivity of the member 28. The controller 18, by controlling the speed of the substrate 36 through the system 40, can thus control the final resistivity of the member 28.

Of course, in an alternate embodiment of the present invention, rather than the controller 18 being connected to the drive, the controller 18 could be connected to a valve that regulates precursor gas flow, a thermostat that regulates oven temperature, or a combination of these parameters.

The value of a given property of the coated substrate depends upon the physico-chemical make-up of the superstrate coating. Altering the conditions within the chemical vapor deposition zone by adjusting a parameter, such as substrate transport velocity, flow rate or oven temperature, results in a modification of the properties of the coated substrate. Thus, the described feedback mechanism provides a means for maintaining the value of superstrate properties within desirable tolerances.

At initial start of manufacture of the member 28, the speed of the substrate drive is set at a predetermined value. The system 10 will operate during this initial start. However, the controller 18 is preferably programmed to ignore signals from the system 10 until the resistivity measurements reach a predetermined range of resistivity measurements.

Preferably, the drive also has a manual control that can be adjusted by an operator viewing readout 16 to bring the speed up or down until the predetermined range is met. When the predetermined range is met, the controller 18 can then automatically take control of the substrate drive to continuously monitor, and increase or decrease the speed of the substrate 36 through the system 40, to maintain the value of superstrate properties within preprogrammed desirable tolerances.

The system 10 may also include a suitable marker to mark the member 28 at the point where it reaches desirable tolerances. Thus, the leading portion of the member 28 before the marker's mark can be removed and discarded for quality control purposes.

Unlike the electrical pick-ups disclosed in U.S. Pat. Nos. 5,141,595 and 5,268,062 and the testing device disclosed in U.S. Pat. No. 5,012,248, the present invention is adapted to test resistivity of the member 28 without physically contacting the member 28. The system 10 is able to measure resistivity over an area of about 1 to 2 square inches at a distance of about ½ inch away from the member 28. Of course, the antenna 20 could be suitably sized, shaped, and positioned to provide any suitable testing parameters. This can be important in testing members such as conductive fabric or sheet material because such a relatively large test area can encompass a large enough number of yarns that individual variations and gaps between yarns of the fabric are averaged out. Thus, the measurements are substantially insensitive to yarn variations.

The present invention can also be used to test magnetic susceptibility in non-conductive materials. This is due to the fact that the output from the transceiver 12 is also affected by the magnetic susceptibility of a material being tested. Unlike the system described in U.S. Pat. No. 4,408,156, the present invention is much simpler. It merely measures reflected radiation which is then linearized and calibrated in surface resistance units. U.S. Pat. No. 4,408,156 computes the differences among transmitted, absorbed, and reflected energy and needs two sensors located on both sides of the sheet article.

In addition, unlike U.S. Pat. No. 4,408,156, the present invention is being used in an active manufacturing quality control system and not merely an identification system. In a preferred embodiment, the microwave radiation from the transceiver is polarized. Conductive fabric yarns that are perpendicular to the electric field E are not significantly detected. This would also be the case for magnetically susceptible yarns relative to the magnetic field H which is perpendicular to the electric field E.

It should be understood that the foregoing description is only illustrative of the invention. Various alternatives and modifications can be devised by those skilled in the art without departing from the spirit of the invention. Accordingly, the present invention is intended to embrace all such alternatives, modifications and variances which fall within the scope of the appended claims.

What is claimed is:

1. A system for measuring an electromagnetic property of a member, comprising:

transceiver means spaced from the member for directing electromagnetic energy at a region of the member and for receiving reflected electromagnetic from the region, the reflected electromagnetic energy being representative of the electromagnetic property, the transceiver means outputting a transceiver output signal which is representative of the reflected electromagnetic energy;

amplifier means, connected to the transceiver means and receiving the transceiver output signal, for outputting an output current signal which is representative of the transceiver output signal;

display means, connected to the amplifier means and receiving the output current signal, for presenting a display signal which is representative of the output current signal, whereby the electromagnetic property is measured; and a controller connected to the amplifier means and to the display means, the controller being adapted to control an apparatus for coating the member based, at least partially, upon the reflected electromagnetic energy received by the transceiver means.

2. A system as claimed in claim 1, wherein the transceiver means comprises a microwave transmitter and receiver unit.

3. A system as claimed in claim 1 wherein the transceiver means comprises:

an antenna;

a positive power input terminal;

a negative power input terminal;

an oscillator connected to the positive power input terminal;

a capacitor connected between the oscillator and the negative power input terminal;

a load resistor connected to the negative power input terminal; and, a mixer connected to the load resistor and outputting the transceiver output signal.

4. A system as claimed in claim 3, wherein the antenna comprises a horn antenna.

5. A system as claimed in claim 3, wherein the oscillator comprises a Gunn diode, the Gunn diode being operated as an emitter and as a local oscillator.

6. A system as claimed in claim 3, wherein the mixer comprises a Schottky barrier diode.

7. A system as claimed in claim 1, wherein the amplifier means comprises a linearizing amplifier.

8. A system as claimed in claim 7, wherein the linearizing amplifier comprises a plurality of gain stages, each of the gain stages being adapted for activation at respective transceiver output signal levels for optimum linearization of the output current signal across a range of transceiver output signal levels.

9. A system as claimed in claim 1, wherein the display means comprises a digital readout.

10. A system as claimed in claim 1, further comprising a backing plate disposed spaced from and opposite the transceiver means, the member extending between the backing plate and the transceiver means.

11. A control system for an apparatus adapted to apply a coating to a member, the control system comprising:

a transceiver for directing electromagnetic energy at a first region of the member having been coated by the coating and for receiving reflected electromagnetic energy from the first region; and a controller connected to the transceiver and connectable to the apparatus for varying a manufacturing process parameter of the apparatus in response to the reflected energy received by the transceiver to thereby adjust an electromagnetic property of a second region of the member when the coating is applied to the second region.

\* \* \* \* \*